(12) United States Patent
Shin et al.

(10) Patent No.: US 12,553,129 B2
(45) Date of Patent: Feb. 17, 2026

(54) ELECTROCHEMICAL REDUCTION OF SURFACE METAL OXIDES

(71) Applicant: Applied Materials, Inc., Santa Clara, CA (US)

(72) Inventors: Yoon Ah Shin, Santa Clara, CA (US); Bencherki Mebarki, Santa Clara, CA (US); Joung Joo Lee, San Jose, CA (US); Xianmin Tang, San Jose, CA (US); Thai Cheng Chua, Cupertino, CA (US); Christian W. Valencia, Alhambra, CA (US)

(73) Assignee: Applied Materials, Inc., Santa Clara, CA (US)

( * ) Notice: Subject to any disclaimer, the term of this patent is extended or adjusted under 35 U.S.C. 154(b) by 575 days.

(21) Appl. No.: 18/077,225

(22) Filed: Dec. 7, 2022

(65) Prior Publication Data
US 2024/0191353 A1 Jun. 13, 2024

(51) Int. Cl.
| C23C 16/455 | (2006.01) |
| H01J 37/32 | (2006.01) |
| H01L 21/02 | (2006.01) |

(52) U.S. Cl.
CPC .. *C23C 16/45536* (2013.01); *H01J 37/32192* (2013.01); *H01L 21/02057* (2013.01)

(58) Field of Classification Search
CPC . C23C 16/45536; C23C 16/511; C23C 16/56; C23C 16/40
See application file for complete search history.

(56) References Cited

U.S. PATENT DOCUMENTS

| 7,589,028 B1 | 9/2009 | Cho et al. |
| 2010/0098874 A1 | 4/2010 | Schroder |
| 2011/0262657 A1 | 10/2011 | Pope et al. |
| 2014/0256127 A1 | 9/2014 | Spurlin et al. |
| 2015/0001728 A1 | 1/2015 | Chen et al. |
| 2016/0002771 A1 | 1/2016 | Song et al. |

(Continued)

FOREIGN PATENT DOCUMENTS

| CN | 200957351 Y | * 10/2007 | ............ B01J 19/12 |
| CN | 104745757 | * 7/2015 | ............ C21B 13/10 |
| JP | 2010-138023 | * 6/2010 | ............ C01B 13/14 |

(Continued)

OTHER PUBLICATIONS

Mizuno, Nobuyuki, et al., "Microwave-based extractive metallurgy to obtain pure metals: A review". Cleaner Engineering and Technology 5 (2021) 100306 pp. 1-11.*

(Continued)

*Primary Examiner* — Bret P Chen
(74) *Attorney, Agent, or Firm* — SERVILLA WHITNEY LLC

(57) ABSTRACT

Methods for reducing metal oxide layers on semiconductor devices to pure metal layers using microwave radiation are described. The method includes exposing a semiconductor substrate surface to microwave radiation to reduce a metal oxide layer on a metal material. The semiconductor substrate surface may have at least one feature extending a depth from the substrate surface to a bottom and having two sidewalls, where the bottom includes the metal oxide layer and the two sidewalls include a dielectric material.

20 Claims, 5 Drawing Sheets

(56) References Cited

U.S. PATENT DOCUMENTS

2020/0306802 A1    10/2020  Alba et al.

FOREIGN PATENT DOCUMENTS

| | | | | | |
|---|---|---|---|---|---|
| JP | 2010-138023 | A | * | 6/2010 | ............. C01B 13/14 |
| JP | 2012-69650 | | * | 4/2012 | ............. H01L 27/10 |
| JP | 5388398 | | * | 10/2013 | ............... C22B 9/22 |
| TW | 201406645 | A | * | 2/2014 | ............... B82B 3/00 |
| WO | WO 2016/190713 | A1 | * | 12/2016 | ............... H05H 1/24 |

OTHER PUBLICATIONS

Kumar, Ravindra, et al., "Reduction of Iron Oxide using Microwave Irradiation". International Journal of Scientific Research & Engineering Trends, vol. 6, Issue 6, Nov.-Dec. 2020, pp. 3319-3325.*

Jakhar, Rishika, et al., "Microwave reduction of graphene oxide". Carbon, vol. 70, Dec. 2020, pp. 277-293.*

Joret, J., et al., "Effect of microwaves on the rate of dissolution of metal oxides (C0304 and CeO 2) in nitric acid". Hydrometallurgy 45 (1997) 1-12.*

Standish, N., et al., "Microwave Application in the Reduction of Metal Oxides with Carbon". Journal of Microwave Power and Electromagnetic Energy, vol. 25, 1990—Issue 3, pp. 177-180. Abstract Only.*

PCT International Search Report and Written Opinion in PCT/US2023/081095 dated Mar. 25, 2024, 10 pages.

* cited by examiner

ELECTROCHEMICAL REDUCTION OF SURFACE METAL OXIDES

TECHNICAL FIELD

Embodiments of the disclosure generally relate to methods for converting surface metal oxides to pure metal. In particular, embodiments of the disclosure pertain to methods for reducing metal oxides by microwave processes.

BACKGROUND

Exposing pure metal materials to air can result in a thin layer of metal oxide being formed on the surface of the metal. This surface layer of metal oxide can interfere with the selectivity of subsequent processing steps and increase resistance of interconnects. Accordingly, there is a need for methods of preventing and/or cleaning metal oxides from the surface of metal materials.

While integrated processing apparatus and transportation of wafers under vacuum has decreased the need for removal of these metal oxide layers, the current preclean methods typically require a hydrogen plasma, high processing temperatures (greater than 300° C.), and/or high energy argon (Ar) sputtering. However, these processes can often damage adjacent dielectric materials (e.g., feature sidewalls) and adversely affect the selectivity of many metal deposition processes (e.g., selective tungsten deposition).

Also, current preclean methods need to be developed and/or tuned for different metal oxide materials (e.g., WOx, MoOx, CoOx, RuOx, CuOx, etc). Each different material may requires a different plasma source, different reactant gas mixtures or chemical soaks, and/or different processing conditions (e.g., temperature, pressure).

Accordingly, there is a need for universal methods of converting surface metal oxides to pure metal. Further, there is particular need for processes performed at relatively low temperatures without damaging surrounding materials.

SUMMARY

One or more embodiments of the disclosure are directed to a method of reducing a surface metal oxide layer. The method comprises exposing the metal oxide layer on a metal material to microwave radiation.

Additional embodiments of the disclosure are directed to a method of reducing molybdenum oxide. The method comprises exposing a substrate surface having at least one feature therein to microwave radiation to reduce a molybdenum oxide layer on a molybdenum metal material. The at least one feature extends a depth from the substrate surface to a bottom comprising the molybdenum oxide layer and has two sidewalls comprising a low-k dielectric.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
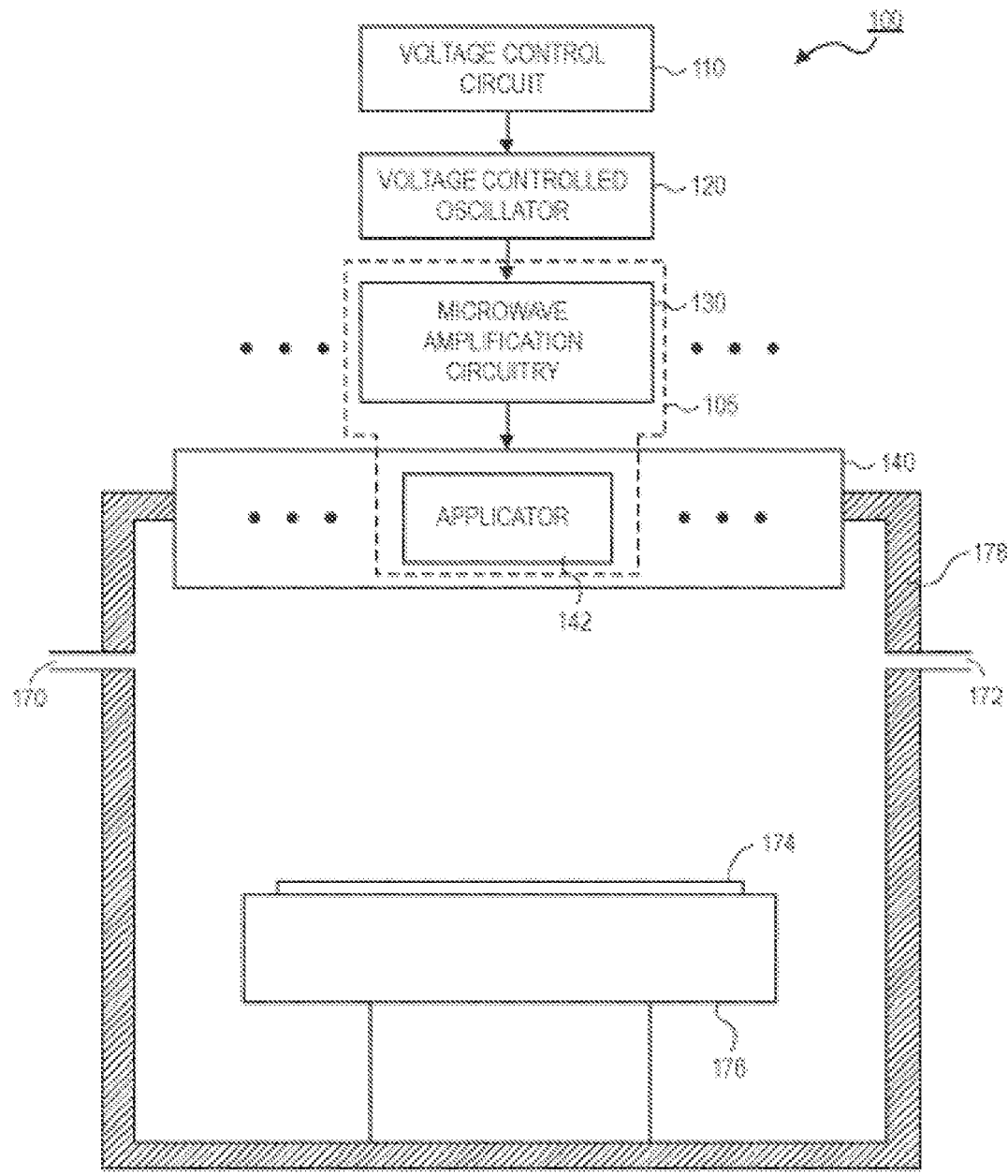
FIG. 1 illustrates a schematic diagram of a microwave processing tool that includes a microwave source according to one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15% or less, of the numerical value. For example, a value differing by ±14%, ±10%, ±5%, ±2%, ±1%, ±0.5%, or ±0.1% would satisfy the definition of "about."

As used in this specification and the appended claims, the term "substrate" or "wafer" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate surface" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

The substrate surface may have one or more features formed therein, one or more layers formed thereon, and combinations thereof. The shape of the feature can be any suitable shape including, but not limited to, trenches, holes and vias (circular or polygonal). As used in this regard, the term "feature" refers to any intentional surface irregularity. Suitable examples of features include but are not limited to trenches, which have a top, two sidewalls and a bottom extending into the substrate, and vias which have one or more sidewall extending into the substrate to a bottom.

The term "on" indicates that there is direct contact between elements. The term "directly on" indicates that there is direct contact between elements with no intervening elements.

As used in this specification and the appended claims, the terms "precursor", "reactant", "reactive gas" and the like are used interchangeably to refer to any gaseous species that can react with the substrate surface.

Embodiments of the disclosure advantageously provide methods for reducing surface metal oxides at relatively low temperatures without affecting neighboring materials. Specific embodiments advantageously provide methods of reducing metal oxides which utilize a microwave process. In some embodiments, the metal oxide layer is not exposed to a plasma.

The embodiments of the disclosure are described by way of the Figures, which illustrate processes, substrates and apparatus in accordance with one or more embodiments of the disclosure. The processes, schema and resulting substrates shown are merely illustrative of the disclosed processes, and the skilled artisan will recognize that the disclosed processes are not limited to the illustrated applications.

Referring to FIG. 1, a cross-sectional illustration of an exemplary processing tool 100 is shown. The processing tool 100 may be a processing tool suitable for any type of processing operation that utilizes microwaves. While the embodiments described in detail herein are directed to microwave processing methods, it is to be appreciated that additional processing methods (including plasma processing methods) may also be practiced on processing tool 100. Further, it is also to be appreciated that the PEALD methods described herein may also be performed using differing processing tools.

Generally, the processing tool 100 includes a chamber 178. In processing tools 100 that are used for substrate processing, the chamber 178 may be a vacuum chamber. A vacuum chamber may include a pump (not shown) for removing gases from the chamber to provide the desired vacuum. Additional embodiments may include a chamber 178 that includes one or more gas lines 170 for providing processing gasses into the chamber 178 and exhaust lines 172 for removing byproducts from the chamber 178. While not shown, it is to be appreciated that the processing tool may include a showerhead or other gas distribution assembly for evenly distributing the processing gases over a substrate 174.

In some embodiments, the substrate 174 may be supported on a chuck 176. For example, the chuck 176 may be any suitable chuck, such as an electrostatic chuck. The chuck may also include cooling lines and/or a heater to provide temperature control to the substrate 174 during processing.

The processing tool 100 includes one or more microwave sources 104. The microwave source 104 may include solid state microwave amplification circuitry 130 and an applicator 142. In some embodiments, a voltage control circuit 110 provides an input voltage to a voltage controlled oscillator 120 in order to produce microwave radiation at a desired frequency that is transmitted to the solid state microwave amplification circuitry 130 in each microwave source 104. After processing by the microwave amplification circuitry 130, the microwave radiation is transmitted to the applicator 142. In some embodiments, an array 140 of applicators 142 are coupled to the chamber 178 and each function as an antenna for coupling the microwave radiation to the substrate 174 in the chamber 178.

Figure 2:
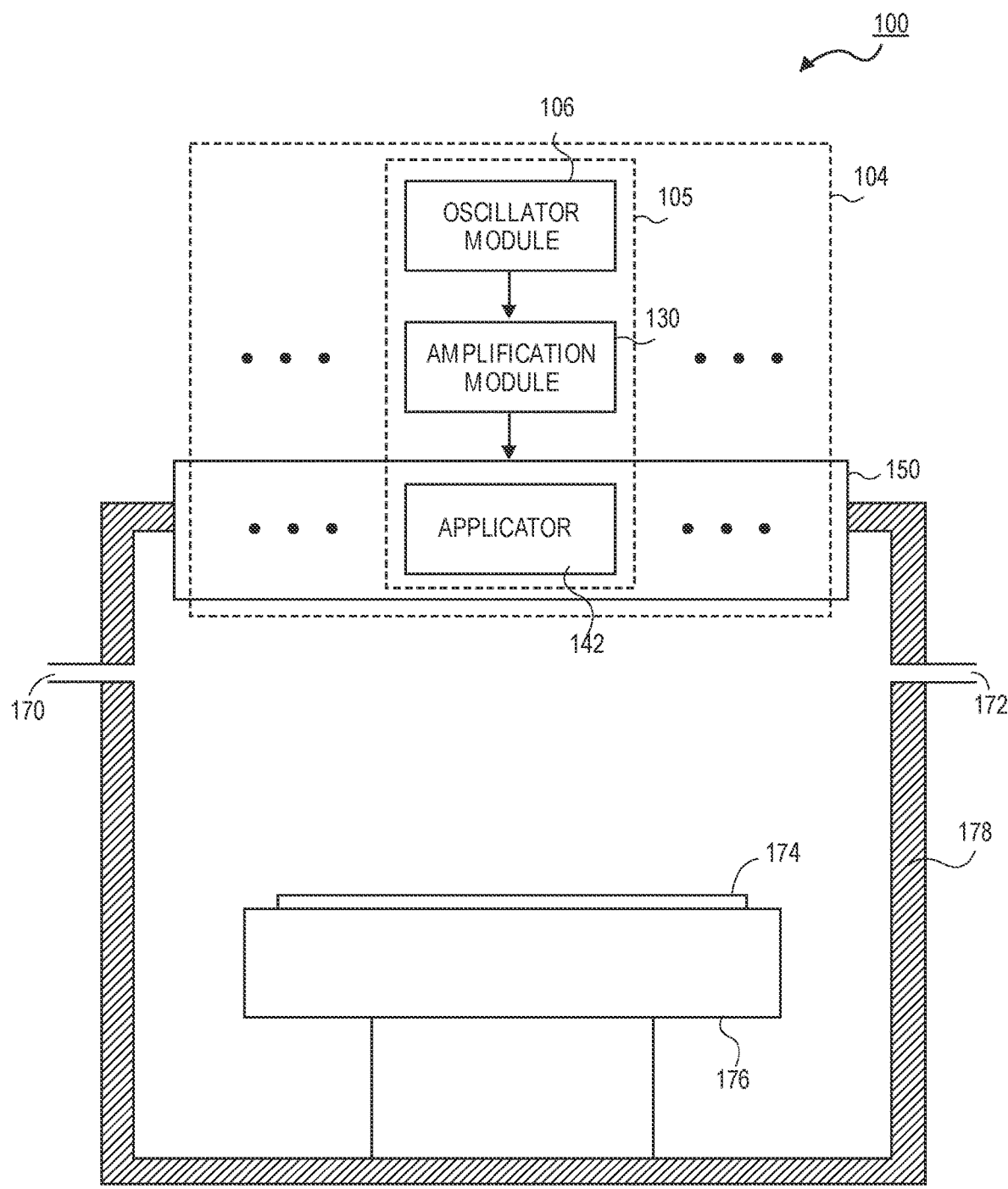
FIG. 2 is a schematic of a semiconductor processing tool with a modular microwave source according to one or more embodiments of the disclosure.
Figure 3:
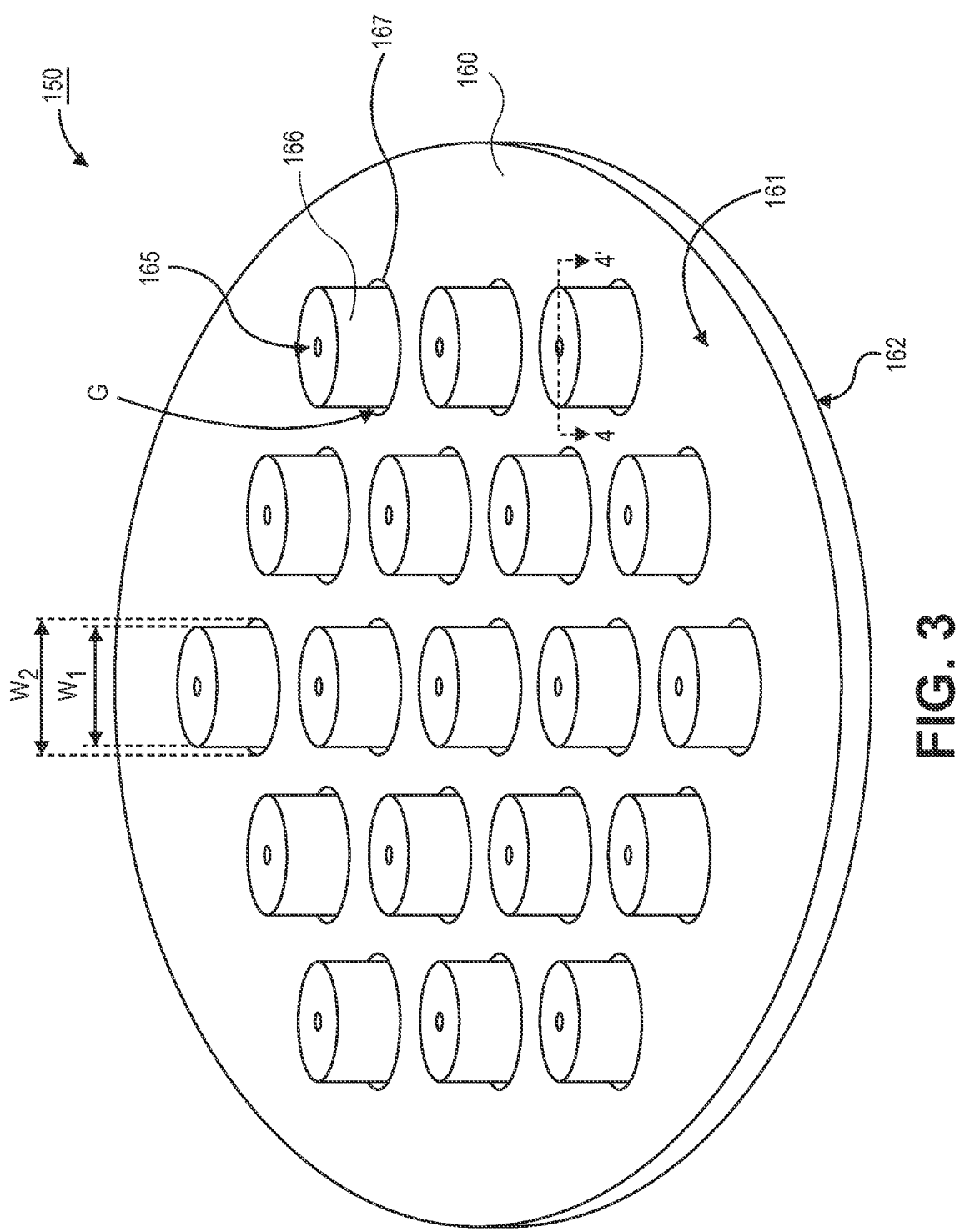
FIG. 3 is a perspective view illustration of a source array for a modular microwave source according to one or more embodiments of the disclosure.
Figure 4:
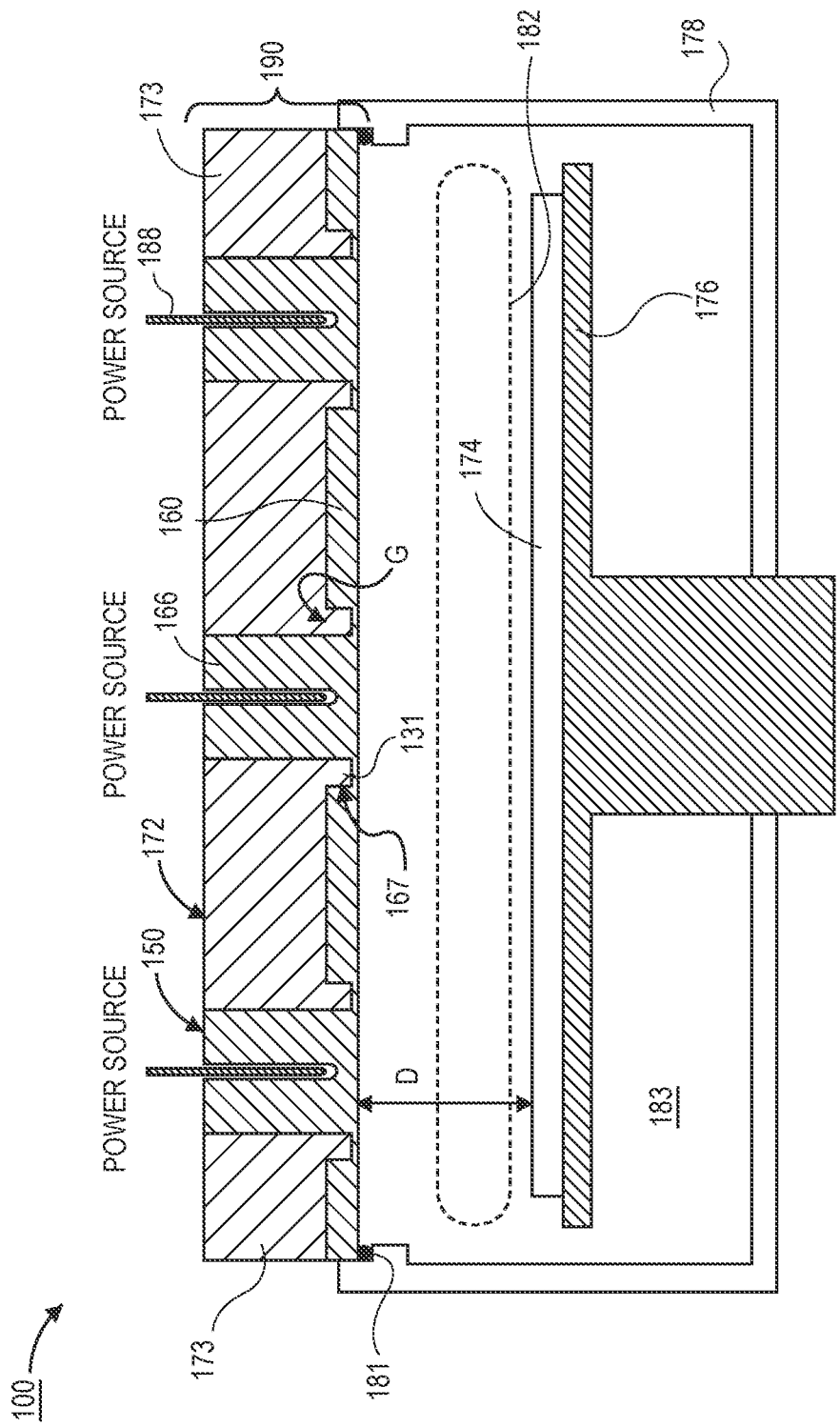
FIG. 4 is a cross-sectional illustration of a processing chamber for reducing surface metal oxides according to one or more embodiments of the disclosure.

Referring now to FIGS. 2-4, a series of illustrations depicting a microwave processing tool 100 is shown, in accordance with an embodiment. The microwave processing tool 100 generates microwaves that are useful for low temperature reduction of metal oxides.

Referring now to FIG. 2, a cross-sectional illustration of a microwave processing tool 100 (referred to as processing tool 100 for short) is shown, according to an embodiment. The processing tool may emit high-frequency electromagnetic radiation. As used herein, "high-frequency" electromagnetic radiation includes radio frequency radiation, very-high-frequency radiation, ultra-high-frequency radiation, and microwave radiation. "High-frequency" may refer to frequencies between 0.1 MHz and 300 GHz.

Generally, embodiments include a processing tool 100 that includes a chamber 178. In processing tool 100, the chamber 178 may be a vacuum chamber. A vacuum chamber may include a pump (not shown) for removing gases from the chamber to provide the desired vacuum. Additional embodiments may include a chamber 178 that includes one or more gas lines 170 for providing processing gases into the chamber 178 and exhaust lines 172 for removing byproducts from the chamber 178. While not shown, it is to be appreciated that gas may also be injected into the chamber 178 through a source array 150 (e.g., as a showerhead) for evenly distributing the processing gases over a substrate 174.

In an embodiment, the substrate 174 may be supported on a chuck 176. For example, the chuck 176 may be any suitable chuck, such as an electrostatic chuck. The chuck 176 may also include cooling lines and/or a heater to provide temperature control to the substrate 174 during processing. Due to the modular configuration of the high-frequency emission modules described herein, embodiments allow for the processing tool 100 to accommodate any sized substrate 174. For example, the substrate 174 may be a semiconductor wafer (e.g., 200 mm, 300 mm, 450 mm, or larger). Alternative embodiments also include substrates 174 other than semiconductor wafers. For example, embodiments may include a processing tool 100 configured for processing glass substrates, (e.g., for display technologies).

According to an embodiment, the processing tool 100 includes a modular high-frequency emission source 104. The modular high-frequency emission source 104 may comprise an array of high-frequency emission modules 105. In an embodiment, each high-frequency emission module 105 may include an oscillator module 106, an amplification module 130, and an applicator 142. As shown, the applicators 142 are schematically shown as being integrated into the source array 150.

In an embodiment, the oscillator module 106 and the amplification module 130 may comprise electrical components that are solid state electrical components. In an embodiment, each of the plurality of oscillator modules 106 may be communicatively coupled to different amplification modules 130. For example, each oscillator module 106 may be electrically coupled to a single amplification module 130. In an embodiment, the plurality of oscillator modules 106 may generate incoherent electromagnetic radiation. Accordingly, the electromagnetic radiation induced in the chamber 178 will not interact in a manner that results in an undesirable interference pattern.

In an embodiment, each oscillator module 106 generates high-frequency electromagnetic radiation that is transmitted to the amplification module 130. After processing by the amplification module 130, the electromagnetic radiation is transmitted to the applicator 142. In an embodiment, the applicators 142 each emit electromagnetic radiation into the chamber 178. In some embodiments, the applicators 142 couple the electromagnetic radiation to the substrate 174 in the chamber 178.

Referring now to FIG. 3, a perspective view illustration of a source array 150 is shown, in accordance with an embodiment. In an embodiment, the source array 150 comprises a dielectric plate 160. A plurality of cavities 167 are disposed into a first surface 161 of the dielectric plate 160. The cavities 167 do not pass through to a second surface 162 of the dielectric plate 160. The source array 150 may further include a plurality of dielectric resonators 166. Each of the dielectric resonators 166 may be in a different one of the cavities 167. Each of the dielectric resonators 166 may comprise a hole 165 in the axial center of the dielectric resonator 166.

In an embodiment, the dielectric resonators 166 may have a first width W1, and the cavities 167 may have a second width W2. The first width W1 of the dielectric resonator 166 is smaller than the second width W2 of the cavities 167. The difference in the widths provides a gap, G, between a sidewall of the dielectric resonators 166 and a sidewall of the cavity 167. In the illustrated embodiment, each of the dielectric resonators 166 are shown as having a uniform width W1. However, it is to be appreciated that not all dielectric resonators 166 of a source array 150 need to have the same dimensions.

Referring now to FIG. 4, a cross-sectional illustration of a processing tool 100 that includes an assembly 190 is shown, in accordance with an embodiment. In an embodiment, the processing tool comprises a chamber 178 that is sealed by an assembly 190. For example, the assembly 190 may rest against one or more O-rings 181 to provide a vacuum seal to an interior volume 183 of the chamber 178. In other embodiments, the assembly 190 may interface with the chamber 178. That is, the assembly 190 may be part of a lid that seals the chamber 178. In an embodiment, the processing tool 100 may comprise a plurality of processing volumes (which may be fluidically coupled together), with each processing volume having a different assembly 190. In an embodiment, a chuck 179 or the like may support a substrate 174 (e.g., wafer, workpiece, etc.). The substrate 174 may be a distance D from the assembly 190. That is, the chamber 178 may be a vacuum chamber. In an embodiment, the assembly 190 comprises a source array 150 and a housing 172. The source array 150 may comprise a dielectric plate 160 and a plurality of dielectric resonators 166 extending up from the dielectric plate 160. Cavities 167 into the dielectric plate 160 may surround each of the dielectric resonators 166. Sidewalls of the cavity 167 are separated from the sidewall of the dielectric resonator 166 by a gap G. The dielectric plate 160 and the dielectric resonators 166 of the source array 150 may be a monolithic structure (as shown in FIG. 3D), or the dielectric plate 160 and the dielectric resonators 166 may be discrete components.

The housing 172 include rings 131 that fit into the gaps G. In an embodiment, the rings 131 and the conductive body 173 of the housing 172 are a monolithic structure (as shown in FIG. 3D), or the conductive body 173 and the rings 131 may be discrete components. The housing 172 may having openings sized to receive the dielectric resonators 166. In an embodiment, monopole antennas 188 may extend into holes in the dielectric resonators 166. The monopole antennas 188 are each electrically coupled to power sources (e.g., high-frequency emission modules 105).

Embodiments of this disclosure utilize a microwave process. Without intending to be bound by theory, the microwave process described herein is believed to weaken the bonds of metal oxide materials with the help of vibration-rotation motion of metal oxide dipoles at microwave frequencies. The disclosed methods utilize E-field for dipole rotation and B-field for eddy current, which leads to heating of the metal oxide material without affecting other substrate materials. The energy of the microwaves can be tuned low enough that it doesn't substantially damage dielectric materials (e.g., no plasma, low temperature). Further, the disclosed methods are self-limiting by only affecting metal oxides and not metal materials.

Figure 5A:
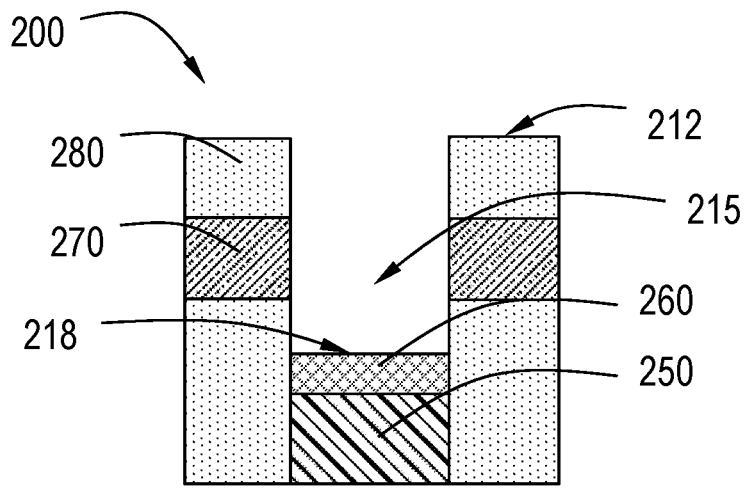
FIGS. 5A and 5B illustrates an exemplary substrate during processing according to one or more embodiments of the disclosure.
Figure 5B:
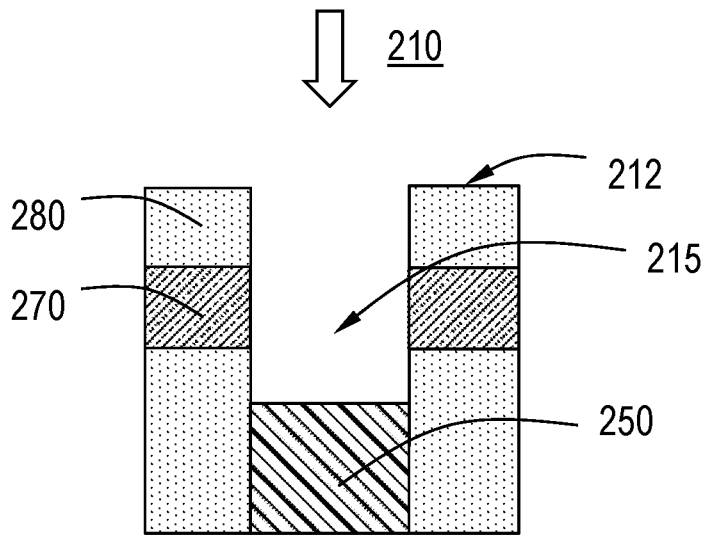

Referring to FIGS. 5A and 5B, a method 200 begins with a metal oxide layer 260 on a metal material 250. At operation 210, the metal oxide layer 260 is exposed to microwave radiation. As used in this regard, exposing a substrate to a "microwave radiation" should be understood to comprise activating a microwave source and exposing the metal oxide layer 260 to the generated microwave radiation. In some embodiments, the microwave process does not generate a reactive plasma. Stated differently, in some embodiments, the metal oxide layer is not exposed to a plasma.

The metal material 250 may comprise any suitable metal. In some embodiments, the metal material 250 and the metal oxide layer 260 comprise the same metal or metals. In some embodiments, the metal material comprises or consists essentially of one or more of molybdenum, tungsten, ruthenium, copper, cobalt, tantalum or titanium.

In some embodiments, the metal oxide layer 260 has a thickness in a range of about 20 Å to about 30 Å. In some embodiments, the method 200 reduces a thickness of the metal oxide layer 260 in a range of about 10 Å to about 30 Å, or in a range of about 20 Å to about 30 Å, or in a range of about 15 Å to about 25 Å. In some embodiments, the method 200 reduces the entire metal oxide layer to pure metal.

In some embodiments, the microwave process at operation 210 comprises exposing the metal oxide layer 260 to a gas flow. In some embodiments, the gas flow is continuous and the microwave exposure is continuous. Stated differently, in some embodiments, neither the gas flow nor the microwave sources are pulsed during the microwave process.

In some embodiments, the gas flow comprises an inert gas. Without being bound by theory, it is believed that exposure to the inert gas flow may help facilitate removal of volatile reaction byproducts. In some embodiments, the inert gas comprises or consists essentially of helium (He) or argon (Ar). In some embodiments, the inert gas comprises or consists essentially of a hydrocarbon (e.g., $CH_4$, $C_2H_6$, $C_2H_4$, $C_2H_2$). In some embodiments, the inert gas comprises or consists essentially of $CO_2$.

In some embodiments, the gas flow comprises a reactant. Without being bound by theory, it is believed that exposure to the reactant gas flow may react with activated oxygen atoms from the metal oxide layer 260 to form volatile species that are more easily purged from the processing chamber. In some embodiments, the reactant comprises or consists essentially of one or more of hydrogen gas ($H_2$) or carbon monoxide (CO).

In some embodiments, the method 200 is performed at relatively low temperatures. The relative low temperatures advantageously result in decreased damage to surrounding materials (e.g., dielectrics). In some embodiments, the metal material is maintained at temperature in a range of about 300° C. to about 400° C. In some embodiments, the metal material is maintained at a temperature of less than or equal to about 300° C. In some embodiments, the metal material is maintained at temperature in a range of about 20° C. to about 50° C. or in a range of about 20° C. to about 100° C.

In some embodiments, the period of exposure is controlled to reduce a predetermined depth of the metal oxide layer 260. In some embodiments, the period is in a range of about 60 seconds to about 600 seconds, in a range of about 60 seconds to about 300 seconds, or in a range of about 30 seconds to about 120 seconds.

In some embodiments, the power of microwave array 140 is in a range of about 800 W to about 8000 W, or in a range of about 900 W to about 5000 W, or in a range of about 1000 W to about 3000 W.

In some embodiments, the pressure of the 178 may be controlled. In some embodiments, the pressure is maintained in a range of about 1 mTorr to about 10 Torr, or in a range of about 10 mTorr to about 1 Torr, or in a range of about 10 mTorr to about 100 mTorr, or in a range of about 50 mTorr to about 75 mTorr.

Figure 5C:
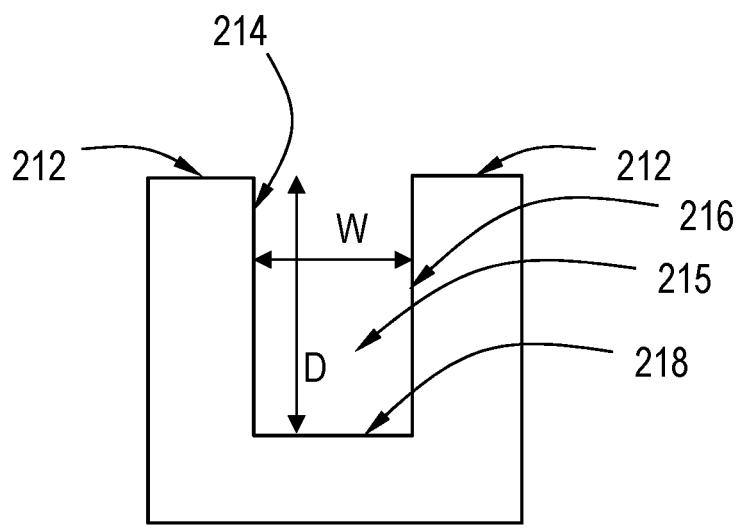
FIG. 5C illustrates a cross-sectional view of an exemplary substrate according to one or more embodiments of the disclosure.

As shown in FIG. 5C, in some embodiments, the metal material 250 is located at the bottom 218 of a substrate feature 215. The feature 215 has sidewalls 214, 216. In some embodiments, at least a portion of the sidewalls 214, 216 comprise a low-k dielectric material 270. In some embodiments, the top surface 212 of the feature comprises a high-k dielectric material 280. In some embodiments, the high-k dielectric material 280 comprises silicon nitride.

In some embodiments, the low-k dielectric material comprises SiOC. In some embodiments, the low-k dielectric material of the sidewalls 214, 216 is substantially undamaged by the method 200. As used in this regard, the low-k dielectric material is "substantially undamaged" if the normalized loss of carbon/silicon is less than or equal to about 30%.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of processing a semiconductor substrate, the method comprising:
exposing a semiconductor substrate surface to microwave radiation, the semiconductor substrate surface having at least one feature formed therein, the at least one feature having two sidewalls and extending a depth to a bottom, the bottom comprising a metal oxide layer on a metal material, wherein the microwave radiation reduces the metal oxide layer to the metal material.

2. The method of claim 1, wherein the metal material comprises one or more of molybdenum, tungsten, ruthenium, cobalt, copper, tantalum, or titanium.

3. The method of claim 1, wherein the metal oxide layer is not exposed to a plasma.

4. The method of claim 1, further comprising exposing the metal oxide layer to a gas flow while exposing the metal oxide layer to the microwave radiation.

5. The method of claim 4, wherein both the gas flow and the microwave radiation are continuous.

6. The method of claim 4, wherein the gas flow comprises an inert gas.

7. The method of claim 6, wherein the inert gas comprises helium (He).

8. The method of claim 4, wherein the gas flow comprises a reactant.

9. The method of claim 8, wherein the reactant is supplied at a flow rate in a range of about 1 sccm to about 50 sccm.

10. The method of claim 8, wherein the reactant comprises hydrogen gas ($H_2$).

11. The method of claim 8, wherein the reactant comprises carbon monoxide (CO).

12. The method of claim 1, wherein the metal material is maintained at a temperature in a range of about 300° C. to about 400° C.

13. The method of claim 1, wherein the metal material is maintained at a temperature less than or equal to about 300° C.

14. The method of claim 1, wherein the metal material is maintained at a temperature in a range of about 20° C. to about 100° C.

15. The method of claim 1, wherein a period of the exposure is in a range of about 60 seconds to about 600 seconds.

16. The method of claim 1, wherein the sidewalls comprise a low-k dielectric material.

17. The method of claim 16, wherein the low-k dielectric material is substantially undamaged by the method.

18. The method of claim 1, wherein the method reduces a thickness of the metal oxide layer in a range of about 15 Å to about 25 Å.

19. A method of processing a semiconductor substrate, the method comprising:
exposing a semiconductor substrate surface having at least one feature therein to microwave radiation to reduce a molybdenum oxide layer on a molybdenum metal material, the at least one feature extending a depth from the substrate surface to a bottom comprising the molybdenum oxide layer and having two sidewalls comprising a low-k dielectric material.

20. The method of claim 19, wherein the low-k dielectric material is substantially undamaged by the method.

* * * * *